United States Patent [19]

Pelley, III et al.

[11] Patent Number: 4,691,300
[45] Date of Patent: Sep. 1, 1987

[54] REDUNDANT COLUMN SUBSTITUTION ARCHITECTURE WITH IMPROVED COLUMN ACCESS TIME

[75] Inventors: Perry H. Pelley, III; Alan Lewandowski, both of Austin, Tex.

[73] Assignee: Motorola, Inc., Schaumburg, Ill.

[21] Appl. No.: 811,856

[22] Filed: Dec. 20, 1985

[51] Int. Cl.⁴ .............................................. G11C 13/00
[52] U.S. Cl. ...................................... 365/200; 371/10
[58] Field of Search ......................... 365/200, 201, 96; 371/10

[56] References Cited

U.S. PATENT DOCUMENTS 4,459,685 7/1984 Sud et al. ............................ 365/200
4,471,472 9/1984 Young ................................. 365/200

Primary Examiner—Joseph A. Popek
Attorney, Agent, or Firm—John A. Fisher; Jeffery Van Myers; Jonathan P. Meyer

[57] ABSTRACT

An apparatus and method for redundant column substitution in a memory device with column redundancy. Rather than inhibiting normal column decoding and selecting in response to a defective column address, the present invention proceeds in parallel with normal column access and redundant column access. The I/O multiplexer receives both the normal and redundant data and, in response to an input from the redundant column decoder, selects the redundant data. Column access time is improved in the case of substituted redundant columns due to the lack of inhibiting the normal column select process. Redundant columns are located physically close to the I/O multiplexer to provide for shorter I/O lines and further improved access time for the redundant columns. Floating normal bit lines are avoided in this scheme since normal column selection is not inhibited.

4 Claims, 3 Drawing Figures

FIG. 1 —PRIOR ART—

REDUNDANT COLUMN SUBSTITUTION ARCHITECTURE WITH IMPROVED COLUMN ACCESS TIME

FIELD OF THE INVENTION

The present invention relates, in general, to a memory device having redundancy and improved access time. More particularly, the invention relates to a memory device having redundant columns and to a method of selecting the redundant columns in such a device which provides improved column access time and other advantages.

BACKGROUND OF THE INVENTION

As memory devices fabricated in silicon and other semiconductor materials have become increasingly complex, it has become common practice to include in each device a certain number of redundant elements. These elements are activated and defective elements are de-activated, typically through the use of on-circuit fuses, when the inevitable manufacturing defects appear in the primary elements.

The storage elements of such memory devices are arranged in a matrix of columns and rows, so that an individual element may be addressed by selecting the appropriate column and row. It has become common to include entire redundant rows and columns on each memory device and to include additional circuits to replace a defective column or row with one of the redundant columns or rows.

In some prior art memory devices with redundancy, fuses associated with each storage element are "blown" by means of a high current or a laser beam to replace a defective element with a redundant one. This, of course, requires substantial die area for the large number of required fuses.

Other types of prior art memory devices with redundancy are capable of replacing entire columns of storage elements with redundant ones. This is accomplished by including a redundant address decoder, which can be programmed by fuse-blowing, on the die. The redundant decoder responds to those column addresses corresponding to defective columns by providing an electrical deselect signal to the normal decoder and providing a redundant select signal which acts to allow a redundant column access to an I/O line normally used by one of the normal columns.

This later scheme for redundancy is disadvantageous when access time is critical. The time necessary to allow the redundant column decoder to evaluate the address, inhibit the normal column decoder and select the redundant column is significant when compared to normal access time. Thus, parts using redundant columns are slower than parts in which none of the redundant columns are used.

It is possible to avoid the problem of increased column access time by including a fuse at the sense amplifier of each column and blowing the fuses of defective normal columns, but this approach leaves "floating" normal storage elements.

SUMMARY OF THE INVENTION

Accordingly, it is an object of the present invention to provide a redundant column substitution architecture with improved column access time.

It is a further object of the present invention to provide a method of redundant column substitution which presents no significant increase in column access time due to redundant column substitution.

Yet a further object of the present invention is to provide a method of implementing column redundancy which does not leave floating bit lines when a redundant column is activated.

These and other objects and advantages of the present invention are provided by intercepting the data from the defective column of a memory device with column redundancy at the I/O multiplexer of the memory. The normal column decoder is not inhibited, thus leaving no floating bit lines. The redundant columns do not share I/O lines to the multiplexer with normal columns. The redundant columns are located near the I/O multiplexer on the die, thus providing very short I/O lines with correspondingly low capacitance and reduced redundant column access time.

These and other objects and advantages of the present invention will be apparent to one skilled in the art from the detailed description below taken together with the drawings.

Detailed Description of the Invention

The present invention relates to the problem of replacing defective elements of a memory device with redundant elements which have been placed on die for that purpose. The particular embodiment described below involves the replacement of entire columns of storage elements with redundant columns of elements. As will be apparent to one skilled in the art, a particular device may combine such a column redundancy scheme with a row redundancy scheme to replace defective rows of storage elements.

Figure 1:
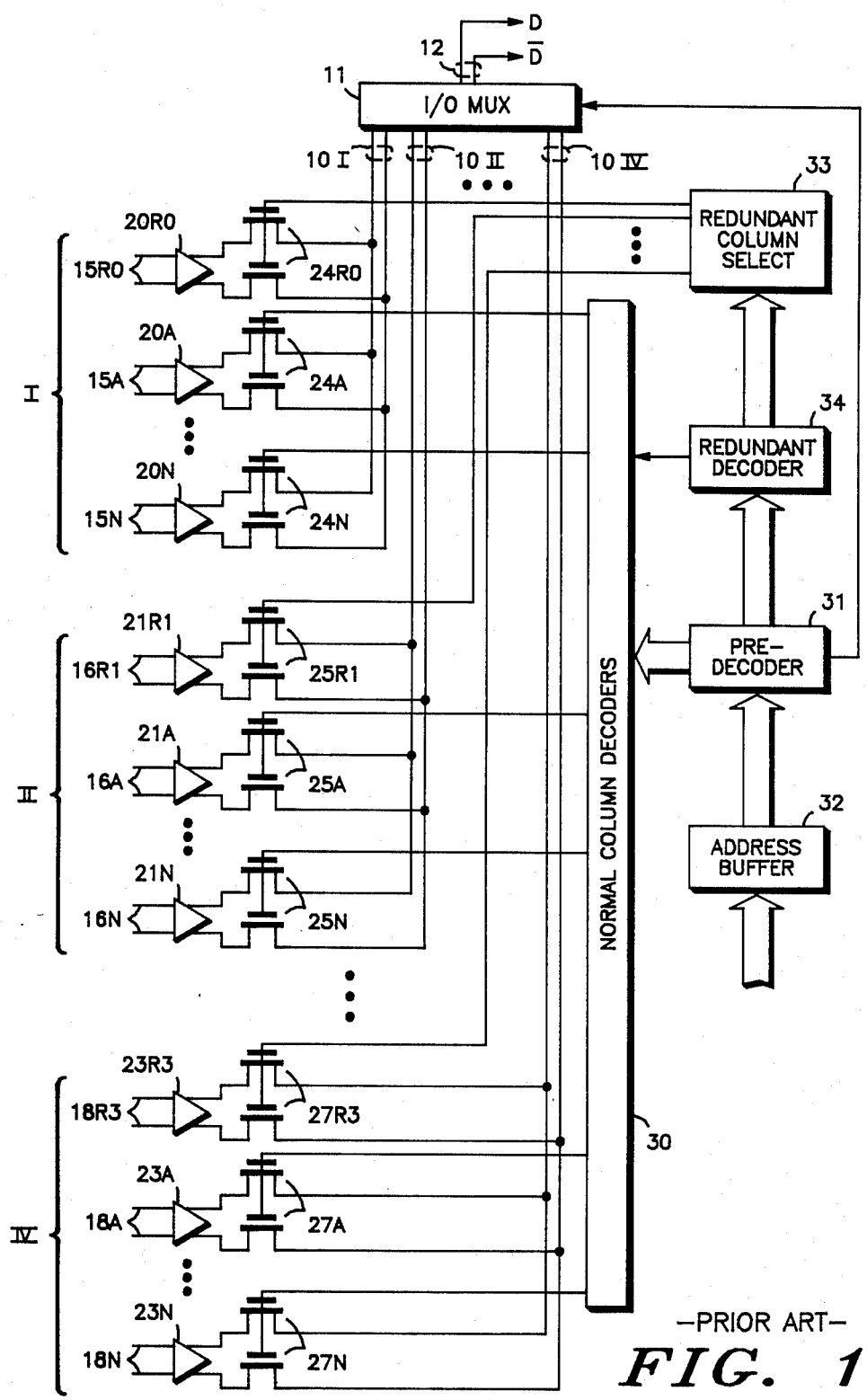
FIG. 1 is a block diagram of a portion of a memory device illustrating the prior art.
Figure 2:
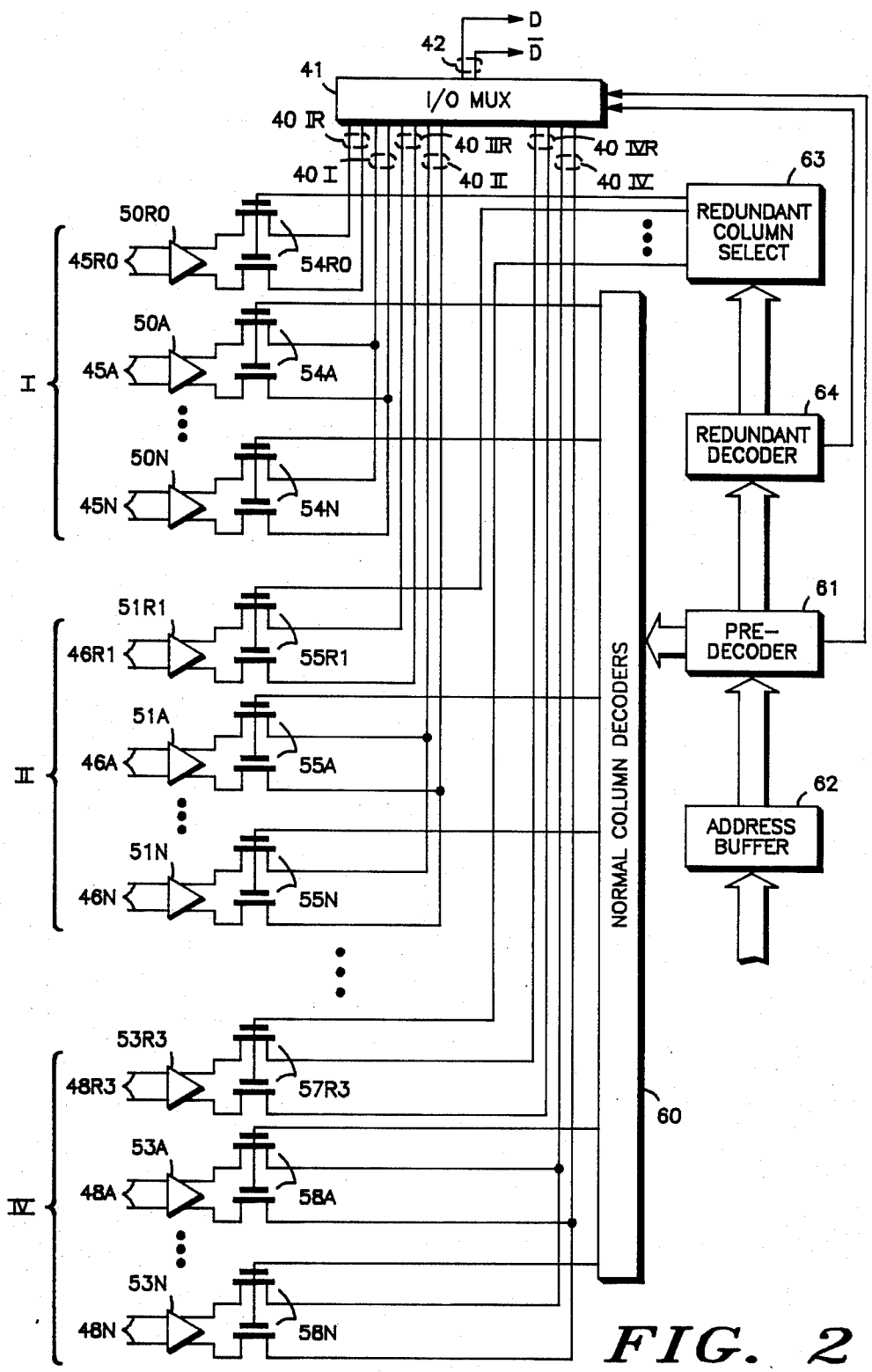
FIG. 2 is a block diagram of a portion of a memory device illustrating the principles of the present invention.

FIG. 1 illustrates a redundant column substitution scheme according to the prior art. It should be noted that the arrangement of the various elements of FIG. 1 and 2 is chosen for ease of description and may not correspond to the physical layout chosen for the integrated circuit. For purposes of input and output, that is writing and reading, the memory array is divided into several groups. In the embodiment described, there are four groups, labelled I-IV with each group having an associated I/O line pair 10I -10IV, respectively. I/O line pairs 10I-10IV couple the several groups of memory elements to an I/O multiplexer 11 which couples I/O line pairs 10I-10IV to data lines 12 which, in turn, are coupled to the data pins of the memory device.

Group I of the memory array comprises a plurality of normal array columns a-N. A like plurality of bit line pairs 15a-15N carry the data from the storage elements to the inputs of a like plurality of sense amplifiers 20a-20N. The outputs of sense amplifiers 20a-20N are coupled to a like plurality of FET switch pairs 24a-24N. FET switch pairs 24a-24N are all coupled to I/O line pair 10I. In addition to normal columns a-N, group I includes a redundant column R0. A bit line pair 15R0 connect to the inputs of a sense amplifier 20R0, whose outputs connect to an FET switch pair 24R0 which, in turn, are connected to I/O line pair 10I.

Group II of the memory array comprises a plurality of normal array columns a-N. A like plurality of bit line pairs 16a-16N carry the data from the storage elements to the inputs of a like plurality of sense amplifiers 21a-21N. The outputs of sense amplifiers 21a-21N are coupled to a like plurality of FET switch pairs 25a-25N. FET switch pairs 25a-25N are all coupled to I/O line pair 10II. In addition to normal columns a-N, group II includes a redundant column R1. A bit line pair 16R1 connect to the inputs of a sense amplifier 21R1, whose outputs connect to an FET switch pair 25R1 which, in turn, are connected to I/O line pair 10II.

To avoid unnecessary complexity, group III of the memory array is omitted from FIG. 1. Group III is substantially identical to the other groups of the memory array.

Group IV of the memory array comprises a plurality of normal array columns a-N. A like plurality of bit line pairs 18a-18N carry the data from the storage elements to the inputs of a like plurality of sense amplifiers 23a-23N. The outputs of sense amplifiers 23a-23N are coupled to a like plurality of FET switch pairs 27a-27N. FET switch pairs 27a-27N are all coupled to I/O line pair 10IV. In addition to normal columns a-N, group IV includes a redundant column R3. A bit line pair 18R1 connect to the inputs of a sense amplifier 23R3, whose outputs connect to an FET switch pair 27R3 which, in turn, are connected to I/O line pair 10IV.

The gates of all of the normal column FET switch pairs (24a-24N-27a-27N) are connected individually to a plurality of normal column decoders 30. Normal column decoders 30 receive an address, or partial address, identifying a particular one of the normal columns from a pre-decoder 31. Pre-decoder 31 receives an address from an address buffer 32 which is connected to the address pins of the memory device. In addition, a portion of the address (typically the higher order bits) is supplied by pre-decoder 31 (or by address buffer 32) to I/O multiplexer 11. The address supplied to normal column decoders 30 serves to identify which column of the memory array is to be accessed. Normal column decoders 30 act on the address by activating the appropriate one of the 4N normal FET switch pairs in order to connect the appropriate sense amplifier to an I/O line pair. The address supplied to I/O multiplexer 11 serves to identify which of the four groups I-IV is being accessed in order that the appropriate I/O line pair 10I-10IV can be connected to data lines 12.

The gates of each of the redundant column FET switch pairs 20R0-23R3 are coupled individually to a redundant column select circuit 33. Redundant column select circuit 33 receives an address from redundant decoder 34 which, in turn, receives an address from pre-decoder 31. In addition, redundant decoder 34 is connected to normal column decoders 30 and provides an inhibit signal thereto.

Redundant decoder 34 is constructed to be programmed, usually by means of fuse blowing, at a late stage in the manufacturing process. Prior to packaging the device, defective normal columns are identified by means of a probe test. Redundant decoder 34 is then programmed to respond to those column addresses corresponding to defective normal columns. On the occurence of such an address, redundant decoder 34 provides an inhibit signal to normal column decoders 30 and an address of one of the redundant columns R0-R3 to redundant column select circuit 33. Redundant column select circuit 33 responds to the address from redundant decoder 34 by activating the appropriate one of FET switch pairs 24R0-27R3.

As will be apparent to one skilled in the art, the above-described design is limited to replacement of a defective normal column with the redundant column in the same group as the defective normal column. This is because I/O multiplexer 11 is not connected to redundant column decoder 34 so that the selected I/O line pair can be altered on the occurence of a defective column address. This modification would provide greater flexibility at the cost of more complexity.

In high density, high speed memory devices the above-described redundant column substitution scheme has several disadvantages. The first is that the column access time for a substituted redundant column is greater than that for a normal column. This is because the time necessary for the redundant column decoder to settle, inhibit the normal column decoders and enable the redundant column select circuit is significantly greater than the time necessary for normal column access. The redundant column decoder is significantly slower than the normal column decoder. For example, a 256K DRAM may have a normal column access time on the order of 25 nanoseconds. This figure may increase by approximately 5 nanoseconds, or 20 percent, for redundant column access. In a market in which access time is a critical selling feature of a memory device, this penalty for redundant column substitution is very disadvantageous. In addition, the above-described design allows the presence of "floating" bit lines caused by the inhibition of the normal column decoders. Thus, a normal row of the memory array which has been prepared for access is not accessed, which may result in subsequent errors.

FIG. 2 illustrates a redundant column substitution scheme according to the present invention. For purposes of input and output, that is writing and reading, the memory array is divided into several groups. In the embodiment described, there are four groups, labelled I-IV, with each group having an associated I/O line pair 40I-40IV, respectively. I/O line pairs 40I-40IV couple the several groups of memory elements to an I/O multiplexer 41 which couples I/O line pairs 40I-40IV to data lines 42 which, in turn, are coupled to the data pins of the memory device. In addition, for each normal I/O line pair 40I-40IV, there is a redundant I/O line pair 40IR-40IVR, respectively.

Group I of the memory array comprises a plurality of normal array columns a-N. A like plurality of bit line pairs 45a-45N carry the data from the storage elements to the inputs of a like plurality of sense amplifiers 50a-50N. The outputs of sense amplifiers 50a-50N are coupled to a like plurality of FET switch pairs 54a-54N. FET switch pairs 54A-54N are all coupled to I/O line pair 40I. In addition to normal columns a-N, group I includes a redundant column R0. A bit line pair 45R0 connect to the inputs of a sense amplifier 50R0, whose outputs connect to an FET switch pair 54R0 which, in turn, are connected to redundant I/O line pair 40IR.

Group II of the memory array comprises a plurality of normal array columns a-N. A like plurality of bit line pairs 46a-46N carry the data from the storage elements to the inputs of a like plurality of sense amplifiers 51a-51N. The outputs of sense amplifiers 51a-51N are coupled to a like plurality of FET switch pairs 55a–55N. FET switch pairs 55a–55N are all coupled to I/O line pair 40II. In addition to normal columns a–N, group II includes a redundant column R1. A bit line pair 46R1 connect to the inputs of a sense amplifier 51R1 whose outputs connect to an FET switch pair 55R1 which, in turn, are connected to redundant I/O line pair 40IIR.

To avoid unnecessary complexity, group III of the memory array is omitted from FIG. 2. Group III is substantially identical to the other groups of the memory array.

Group IV of the memory array comprises a plurality of normal array columns a–N. A like plurality of bit line pairs 48a–48N carry the data from the storage elements to the inputs of a like plurality of sense amplifiers 53a–53N. The outputs of sense amplifiers 53a–53N are coupled to a like plurality of FET switch pairs 57a–57N. FET switch pairs 57a–57N are all coupled to I/O line pair 40IV. In addition to normal columns a–N, group IV includes a redundant column R3. A bit line pair 48R1 connect to the inputs of a sense amplifier 53R3, whose outputs connect to an FET switch pair 57R3 which, in turn, are connected to redundant I/O line pair 40IVR.

The gates of all of the normal column FET switch pairs (54a–54N–57a–57N) are connected individually to a plurality of normal column decoders 60. Normal column decoders 60 receive an address, or partial address, identifying a particular one of the normal columns from a pre-decoder 61. Pre-decoder 61 receives an address from an address buffer 62 which is connected to the address pins of the memory device. In addition, a portion of the address (typically the higher order bits) is supplied by pre-decoder 61 (or by address buffer 62) to I/O multiplexer 41. The address supplied to normal column decoders 60 serves to identify which column of the memory array is to be accessed. Normal column decoders 60 act on the address by activating the appropriate one of the 4N normal FET switch pairs in order to connect the appropriate sense amplifier to an I/O line pair. The address supplied to I/O multiplexer 41 serves to identify which of the four groups I–IV is being accessed in order that the appropriate I/O line pair 40I-4-0IV can be connected to data lines 42. In addition, redundant decoder 64 is connected to I/O multiplexer 41.

The gates of each of the redundant column FET switch pairs 50R0–53R3 are coupled individually to a redundant column select circuit 63. Redundant column select circuit 63 receives an address from redundant decoder 64 which, in turn, receives an address from pre-decoder 61. It should be noted that it is equally suitable to input the raw address directly from address buffer 62 simply by designing redundant decoder 64 accordingly. In the present invention, redundant decoder 64 is not connected to normal column decoders 60. Therefore, normal column decoders 60 are never inhibited.

Redundant decoder 64 is constructed to be programmed, usually by means of fuse blowing, at a late stage in the manufacturing process. Prior to packaging the device, defective normal columns are identified by means of a probe test. Redundant decoder 64 is then programmed to respond to those column addresses corresponding to defective normal columns. On the occurence of such an address, redundant decoder 64 provides a redundant column select signal to I/O multiplexer 41 and an address of one of the redundant columns R0–R3 to redundant column select circuit 63. Redundant column select circuit 63 responds to the address from redundant decoder 64 by activating the appropriate one of FET switch pairs 54R0–57R3. I/O multiplexer 41 responds to the signal from redundant decoder 64 by connecting the indicated redundant I/O line pair to data line pair 42.

As will be apparent to one skilled in the art, I/O multiplexer 41 must provide two functions. During read operations, I/O muliplexer 41 serves as a relatively simple switch to connect one of the I/O line pairs to data line pair 42. During write operations, I/O multiplexer serves both to provide these connections and to provide the necessary driver circuits to carry out the write operation. With this in mind, it can be appreciated that the I/O multiplexer according to the present invention must differ from that of the prior art in two respects. First, I/O multiplexer 41 must be able to handle more incoming I/O line pairs; the normal group line pairs plus the redundant I/O line pairs. This represents a relatively small increase in complexity. Second, either existing write driver cicuits must be utilized for both normal or redundant columns or extra write drivers must be provided which are dedicated to the redundant columns. In the preferred embodiment, a write driver is dedicated to each I/O line pair. The extra drivers this requires may increase the circuit area of the I/O multiplexer, but the additional complexity is not severe.

The fact that the above-described scheme intercepts the defective column data somewhat later in the access path provides several advantages. First, the column access time in the case of a substituted redundant column is somewhat faster than with the prior art approach described above. This is due to the fact that valid column access need not wait for the redundant decoder to analyse each address and inhibit the normal column decoders. Instead, normal column and redundant column access proceed "in parallel" and the unwanted data is simply intercepted at the I/O multiplexer. Second, no floating bit lines are left when the redundant column is substituted, as is the case with some other redundant column substitution schemes.

Figure 3:
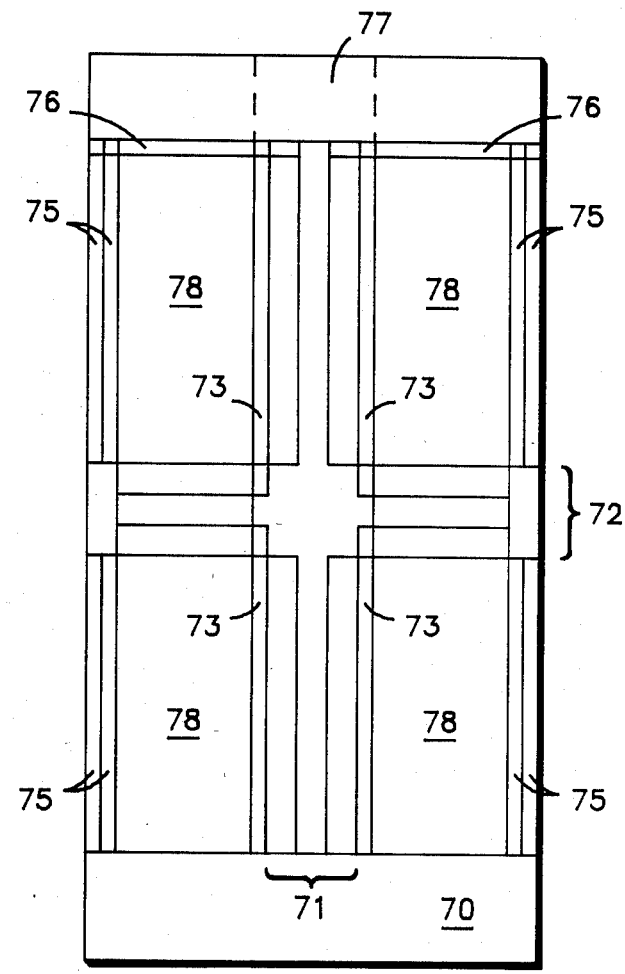
FIG. 3 is an illustration of a die layout illustrating the principles of the present invention.

FIG. 3 is a diagram illustrating the basic layout of a memory device illustrating the principles of the present invention. The important feature of this layout from the standpoint of the present invention is that the redundant columns are located physically near the I/O portion of the device, thus making the I/O line pairs for the redundant columns very short. This provides for very low capacitance on the redundant I/O lines and further decreases column access time for susbstituted redundant columns. At the bottom of FIG. 3, area 70 includes the various clock generators and other necessary circuits. Extending up the middle of the layout from area 70 is an area 71 in which the column decoders are located. A similar area 72 running across the middle of the layout horizontally contains the row decoders and drivers. Immediately adjacent the outside edges of area 71 are narrow, columnar areas 73 in which the redundant rows are located. Double narrow, columnar areas 75 running vertically at the outside edges of the layout contain the sense amplifiers. Intersecting these areas orthogonally near the top of the layout are areas 76 containing the redundant columns. Occupying the central portion of the upper region of the layout is an area 77 in which the I/O multiplexer lies. Finally, four roughly rectangular areas 78 comprise the normal portions of the memory array. The net effect of this layout and the redundant column substitution scheme described above is that column access time for normal columns and for substituted redundant columns is nearly identical.

Several possible modifications to the basic scheme set forth above should be noted. First, while the described embodiment dedicates a separate I/O line pair to each redundant column, it is also possible for two or more redundant column sense amplifiers to share an I/O line pair. Since the redudant column select circuit will only connect one of the sense amplifiers to the line pair at any time, such sharing does not adversely impact performance. Another possible modification involves the simultaneuos access of the redundant columns from more than one group of the memory array. This is performed simply by designing the redundant column select circuit to activate more than one of the FET switch pairs in response to a particular input from the redundant decoder. In effect, this provides a larger block of redundant elements which are accessed by a single address and provides greater flexibility in remedying certain types of defects in the normal array.

As will be apparent to one skilled in the art, the invention disclosed herein provides a redundant column apparatus and method which offers improved redundant column access time and a lack of floating bit lines. While the present invention has been disclosed with reference to a particular embodiment, many modifications and changes will be apparent to those skilled in the art and are within the spirit and scope of the present invention.

We claim:C

1. In a memory device having a predetermined number of normal columns of storage elements and a predetermined number of redundant columns of storage elements, a redundant column substitution apparatus comprising:

a multiplexer having inputs coupled to said normal and redundant columns of storage elements and outputs coupled to data pins of said memory device, said multiplexer being responsive to a control input to select one of said normal columns and said redundant columns;

first switch means interposed between said normal columns of storage elements and said multiplexer for selectively connecting at least one of said normal columns to said multiplexer;

second switch means interposed between said redundant columns of storage elements and said multiplexer for selectively connecting at least one of said redundant columns to said multiplexer;

normal column decoder means for receiving an address and for operating said first switch means redundant decoder means for receiving an address, determining whether said address corresponds to a defective normal column of storage elements and providing at least one output signal in response to an address corresponding to such a defective normal column; and redundant column select means responsive to said at least one output signal received from said redundant decoder means and for operating said second switch means.

2. A memory device according to claim 1 further comprising:

a predetermined number of first line pairs coupling said normal columns to said multiplexer means; and a predetermined number of second line pairs coupling said redundant columns to said multiplexer, each of said second line pairs being shorter than any of said first line pairs.

3. A memory device according to claim 2 wherein said predetermined number of said second line pairs is equal to said predetermined number of redundant columns, providing that each said redundant column is coupled to said multiplexer means by a dedicated line pair.

4. A memory device according to claim 2 wherein said predetermined number of second line pairs is less than said predetermined number of redundant columns.

* * * * *